United States Patent
Tajima et al.

(10) Patent No.: US 9,536,894 B2
(45) Date of Patent: Jan. 3, 2017

(54) NON-VOLATILE MEMORY DEVICE

(71) Applicant: KABUSHIKI KAISHA TOSHIBA, Tokyo (JP)

(72) Inventors: Hikari Tajima, Tokyo (JP); Masaki Kondo, Mie (JP); Tsukasa Nakai, Mie (JP); Takashi Izumida, Kanagawa (JP); Hiroki Tokuhira, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/619,581

(22) Filed: Feb. 11, 2015

(65) Prior Publication Data

US 2016/0035741 A1    Feb. 4, 2016

Related U.S. Application Data

(60) Provisional application No. 62/032,669, filed on Aug. 4, 2014.

(51) Int. Cl.
  *H01L 29/792* (2006.01)
  *H01L 27/115* (2006.01)
  *H01L 29/04* (2006.01)
  *H01L 29/10* (2006.01)

(52) U.S. Cl.
  CPC ..... *H01L 27/11582* (2013.01); *H01L 27/1157* (2013.01); *H01L 29/04* (2013.01); *H01L 29/1033* (2013.01)

(58) Field of Classification Search
  CPC   H01L 27/1157; H01L 27/11582; H01L 29/04; H01L 29/513; H01L 29/518; H01L 29/1037
  USPC .......................................................... 257/324
  See application file for complete search history.

(56) References Cited

U.S. PATENT DOCUMENTS

| | | | |
|---|---|---|---|
| 8,828,853 B2 | 9/2014 | Aoyama et al. | |
| 2011/0186851 A1* | 8/2011 | Son | H01L 29/04 257/60 |
| 2011/0227140 A1* | 9/2011 | Ishiduki | H01L 27/11578 257/324 |
| 2012/0003800 A1* | 1/2012 | Lee | H01L 27/11551 438/261 |
| 2012/0273790 A1* | 11/2012 | Aoyama | H01L 21/02532 257/66 |
| 2013/0270621 A1 | 10/2013 | Mori | |
| 2014/0264547 A1 | 9/2014 | Kawai et al. | |

* cited by examiner

*Primary Examiner* — Matthew Gordon
(74) *Attorney, Agent, or Firm* — Finnegan, Henderson, Farabow, Garrett & Dunner LLP

(57) ABSTRACT

According to an embodiment, a non-volatile memory device includes first electrodes arranged in a first direction, a second electrode disposed on a side of the first electrodes in the first direction, a semiconductor layer extending in the first direction through the first electrodes and the second electrode, and a memory film provided between the semiconductor layer and each of the first electrodes. The semiconductor layer includes crystal grains and has a first portion and a second portion, the first portion being adjacent to the first electrodes, and the second portion being adjacent to at least a part of the second electrode, wherein the first portion includes a larger crystal grain than a crystal grain in the second portion.

1 Claim, 13 Drawing Sheets

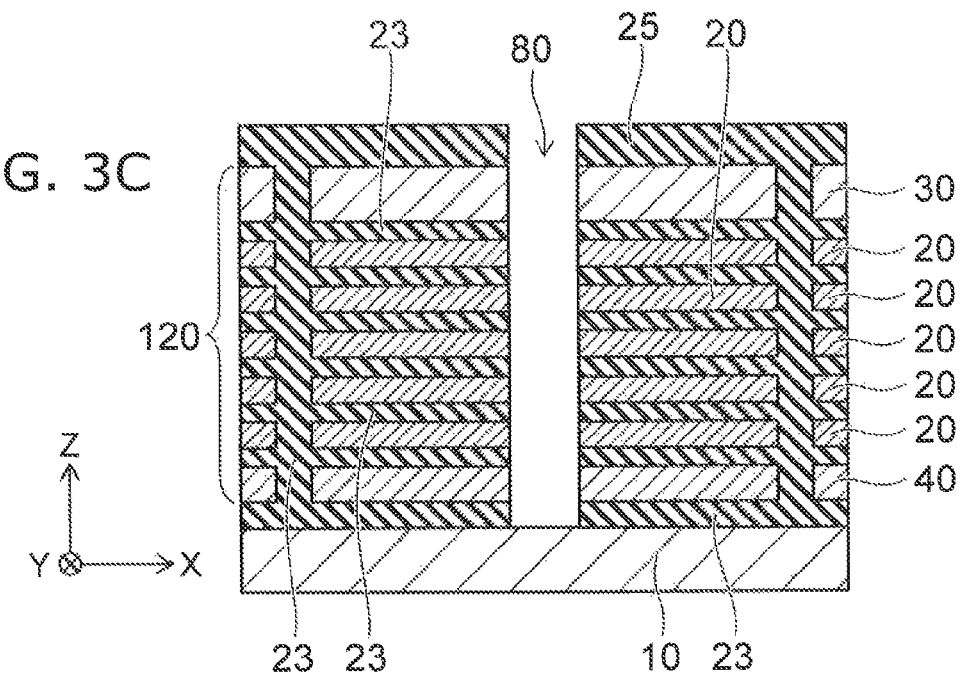
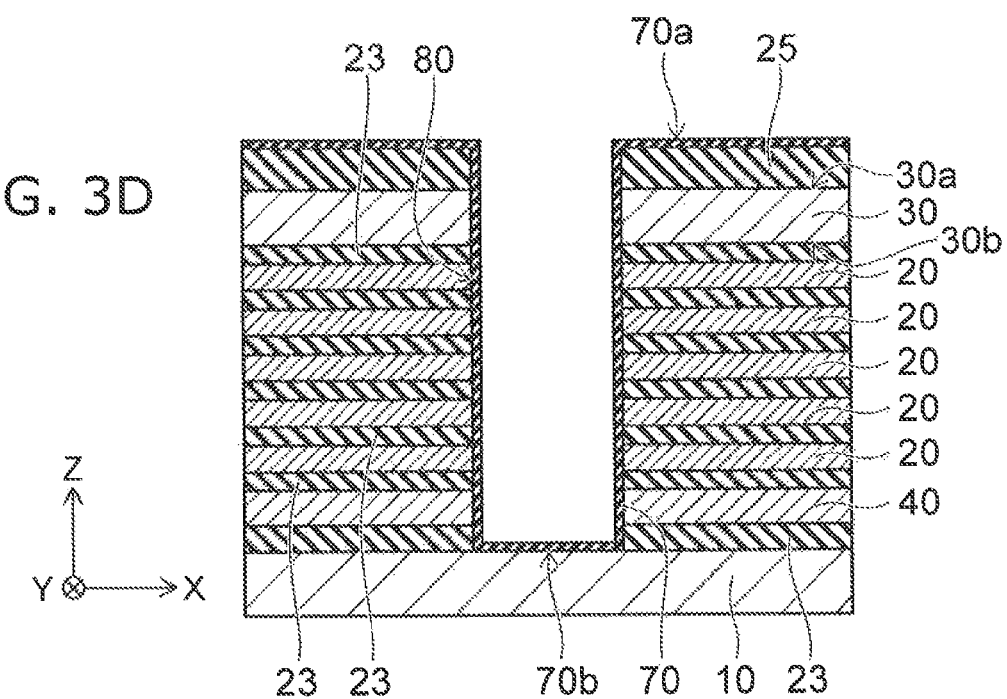

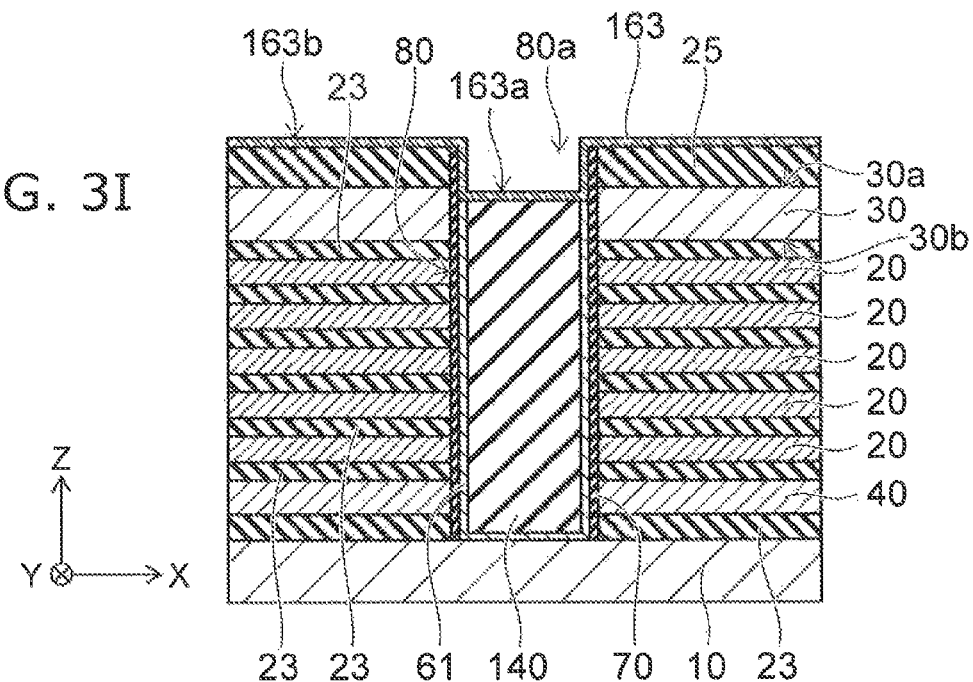
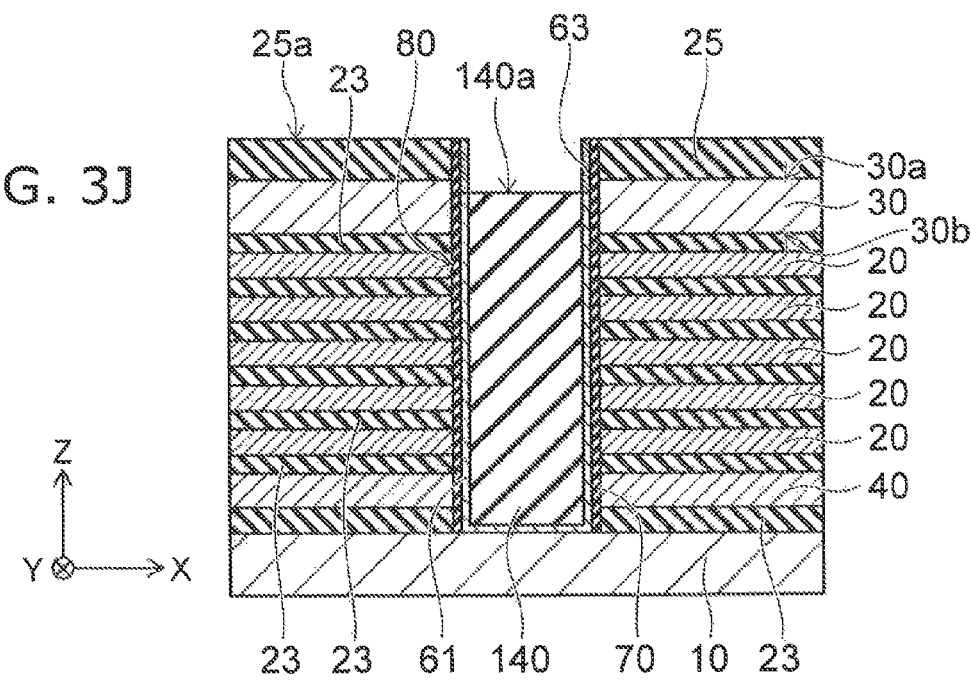

NON-VOLATILE MEMORY DEVICE

CROSS-REFERENCE TO RELATED APPLICATIONS

This application is based upon and claims the benefit of priority from U.S. Provisional Patent Application 62/032,669 filed on Aug. 4, 2014; the entire contents of which are incorporated herein by reference.

FIELD

Embodiments are generally related to a non-volatile memory device.

BACKGROUND

Development of a NAND memory cell array having a three-dimensional structure is being advanced to realize a next-generation non-volatile memory device. The memory cell array having the three-dimensional structure includes multiple word lines that are stacked and a NAND string that is formed in a memory hole extending through the multiple word lines. In the NAND memory cell array, erasing data is performed collectively by memory cell block. Also, it is desirable to improve the data erasing characteristics as the memory capacity is increased.

BRIEF DESCRIPTION OF THE DRAWINGS

FIGS. 3A to 3L are exemplary cross-sectional views schematically showing manufacturing processes of the memory cell array according to the first embodiment;

DETAILED DESCRIPTION

Figure 1:
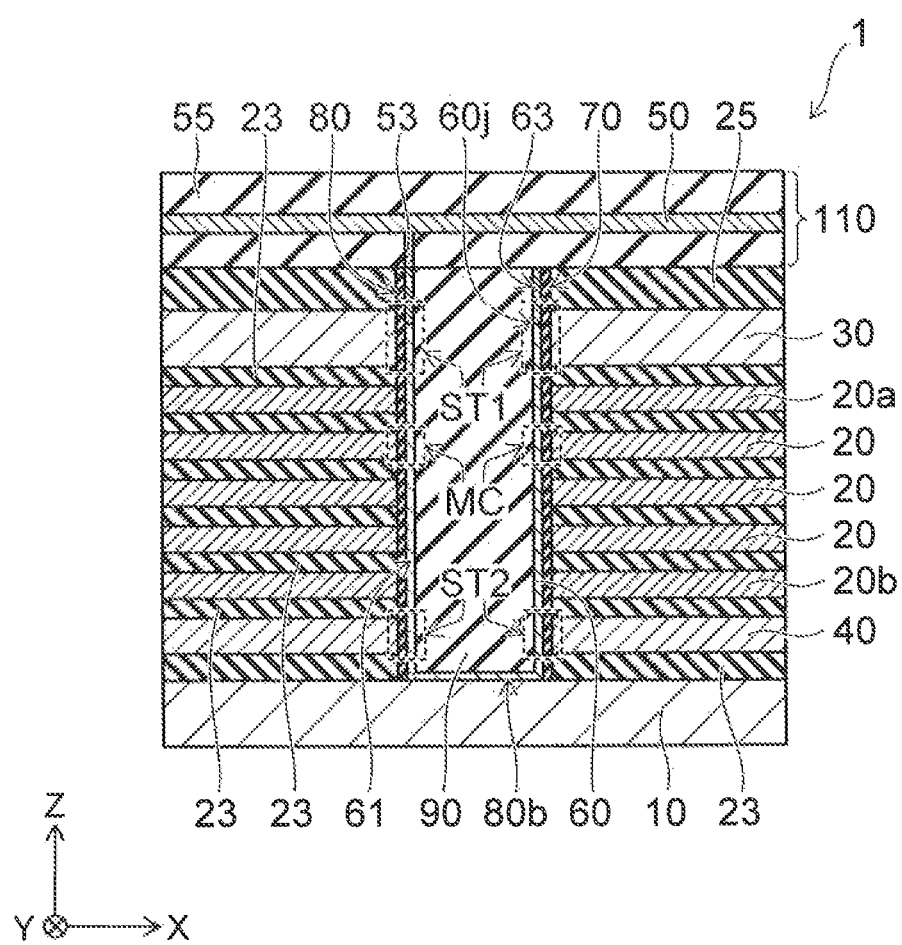
FIG. 1 is an exemplary cross-sectional view schematically showing a memory cell array of a non-volatile memory device according to a first embodiment.

According to an embodiment, a non-volatile memory device includes first electrodes arranged in a first direction, a second electrode disposed on a side of the first electrodes in the first direction, a semiconductor layer extending in the first direction through the first electrodes and the second electrode, and a memory film provided between the semiconductor layer and each of the first electrodes. The semiconductor layer includes crystal grains and has a first portion and a second portion, the first portion being adjacent to the first electrodes, and the second portion being adjacent to at least a part of the second electrode, wherein the first portion includes a larger crystal grain than a crystal grain in the second portion.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. Also, the dimensions and/or the proportions may be illustrated differently between the drawings, even in the case where the same portion is illustrated.

In the description hereinbelow, the dispositions of the components are described with reference to three mutually-orthogonal axis directions shown in the drawings, i.e., an X-direction, a Y-direction, and a Z-direction. Also, there are cases where the Z-direction is described as upward and the direction opposite to the Z-direction is described as downward.

First Embodiment

Figure 2:
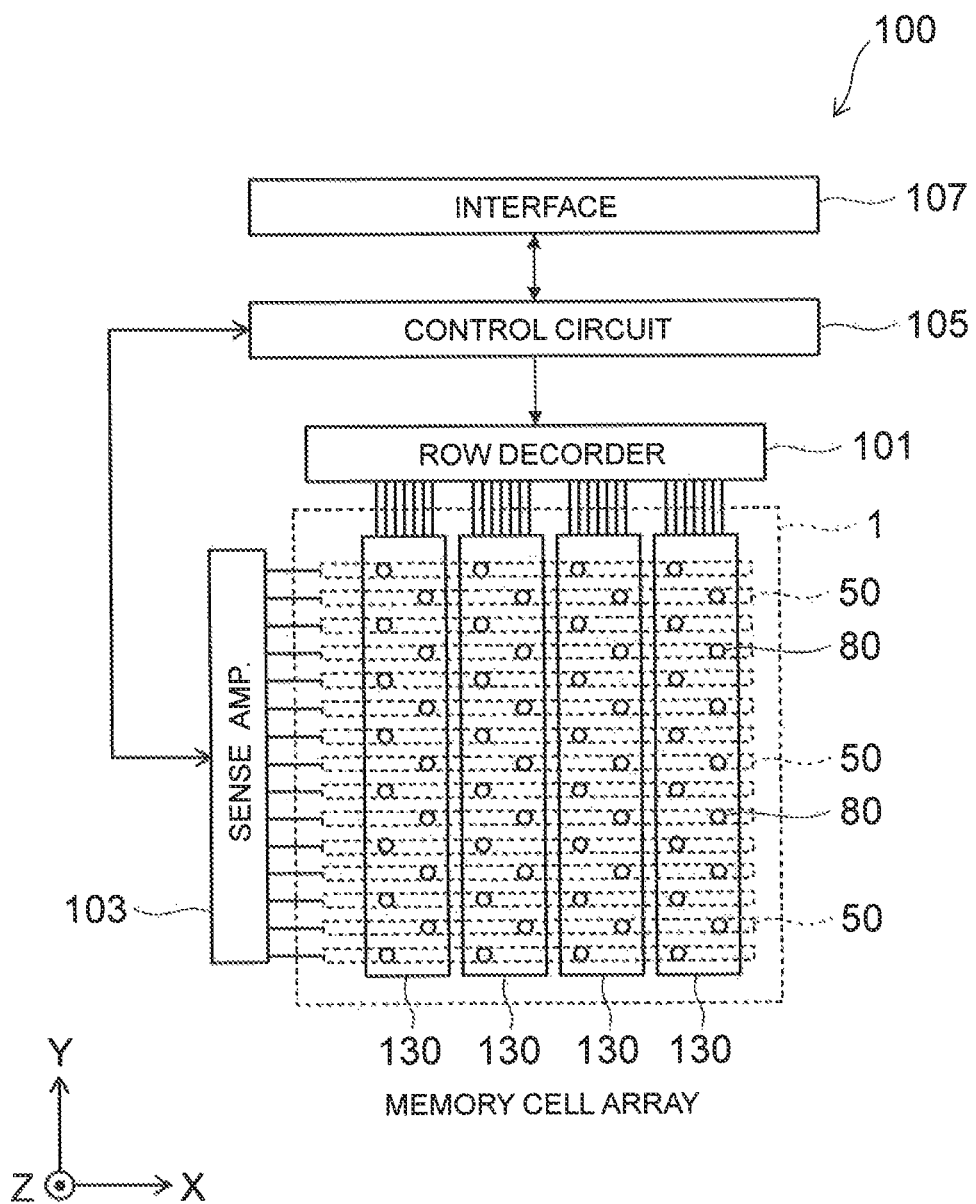
FIG. 2 is an exemplary view schematically showing a constitution of the non-volatile memory device according to the first embodiment.

FIG. 1 and FIG. 2 are schematic views showing a non-volatile memory device 100 according to a first embodiment.

FIG. 1 is a cross-sectional view showing a memory cell array 1 of the non-volatile memory device 100. The memory cell array 1 includes multiple first electrodes (hereinbelow, word lines 20), a second electrode (hereinbelow, a selection gate 30), and a third electrode (hereinbelow, a selection gate 40) that are provided on a first interconnect (hereinbelow, a source layer 10).

As shown in FIG. 1, the selection gate 40, the multiple word lines 20, and the selection gate 30 are disposed to be arranged in this order in a first direction (hereinbelow, the Z-direction) perpendicular to the source layer 10. Further, a second interconnect (a bit line 50) is provided on the side of the selection gate 30 opposite to the word lines 20. The selection gate 30 is disposed between a word line 20a and the bit line 50. The selection gate 40 is disposed between the source layer 10 and a word line 20b. The word line 20a is positioned at the end of the multiple word lines 20 on the bit line 50 side. The word line 20b is positioned at the end of the multiple word lines 20 on the source layer 10 side.

An insulating film 23 is provided between the word lines 20 adjacent to each other in the Z-direction. Also, the Insulating film 23 is provided between the word line 20a and the selection gate 30, between the word line 20b and the selection gate 40, and between the source layer 10 and the selection gate 40. The insulating film 23 electrically insulates the multiple word lines 20, the selection gates 30 and 40, and the source layer 10.

The memory cell array 1 further includes a semiconductor layer (hereinbelow, a channel body 60) and a memory film 70 that extend in the Z-direction from the source layer 10 toward the selection gate 30. The channel body 60 extends through the selection gate 40, the multiple word lines 20, and the selection gate 30 in the Z-direction. The memory film 70 is provided between the channel body 60 and each of the multiple word lines 20.

For example, the memory film 70 extends in the Z-direction along the channel body 60. Also, the memory film 70 extends between the selection gate 30 and the channel body 60 and between the selection gate 40 and the channel body 60.

Specifically, the memory film 70 is provided to cover the inner wall of a memory hole 80 piercing through the multiple word lines 20, the selection gate 30, and the selection gate 40. The channel body 60 is provided on the memory film 70 and covers the wall surface and a bottom surface 80b of the memory hole 80. The channel body 60 is electrically connected to the source layer 10 at the bottom surface 80b of the memory hole 80. Further, a core 90 is provided in the memory hole 80. The core 90 is an insulator. The channel body 60 is positioned between the core 90 and the memory film 70.

The channel body 60 includes a first portion 61 and a second portion 63. For example, the second portion 63 is provided on the first portion 61 in the Z-direction. The first portion 61 opposes each of the multiple word lines 20 with the memory film 70. The memory film 70 is interposed between the first portion 61 and each of the multiple word lines 20. The second portion 63 opposes at least a part of the selection gate 30.

The channel body 60 includes a boundary 60J between the first portion 61 and the second portion 63. Also, the boundary 60j is positioned in a portion of the channel body 60 opposing the selection gate 30.

The channel body 60 is, for example, a polycrystalline semiconductor including multiple crystal grains. The channel body 60 is, for example, polysilicon and includes crystal grains of silicon. Also, the crystal grain size of the first portion 61 is larger than the crystal grain size of the second portion 63. Here, the "crystal grain size" is the average diameter of the crystal grains included in the channel body in this specification, if there is no comment thereon. For example, the crystal grain size is the diameter in the case where a crystal grain of any shape is approximated as a sphere. Also, the crystal grain size may be expressed as an average crystal grain size. The crystal grain size of a semiconductor material such as silicon, etc., can be measured by, for example, a transmission electron microscope (TEM).

Figure 5A:
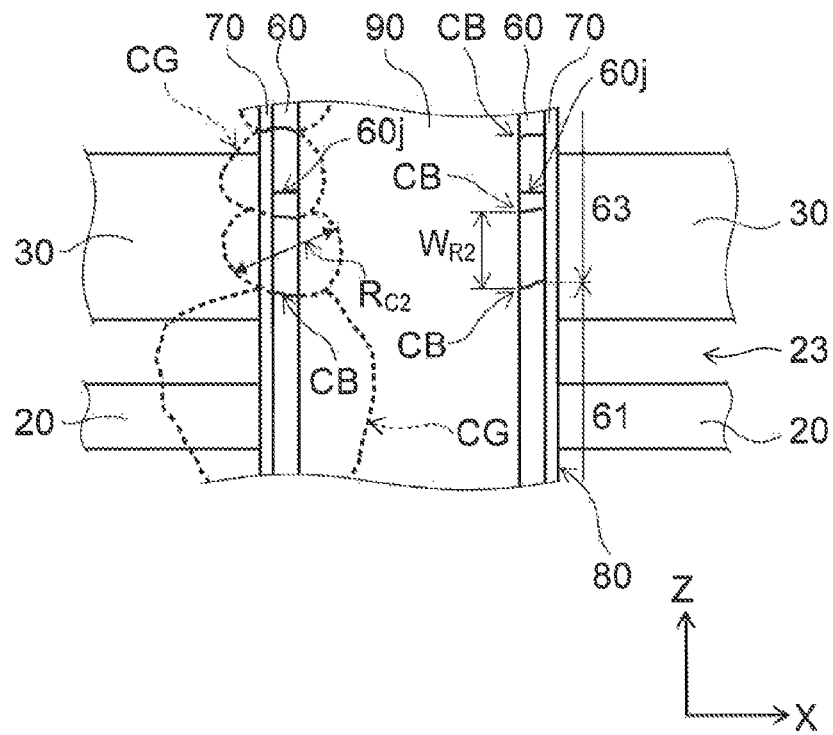
FIGS. 5A and 5B are schematic cross-sectional views showing a channel body of the memory cell array according to the first embodiment.
Figure 5B:
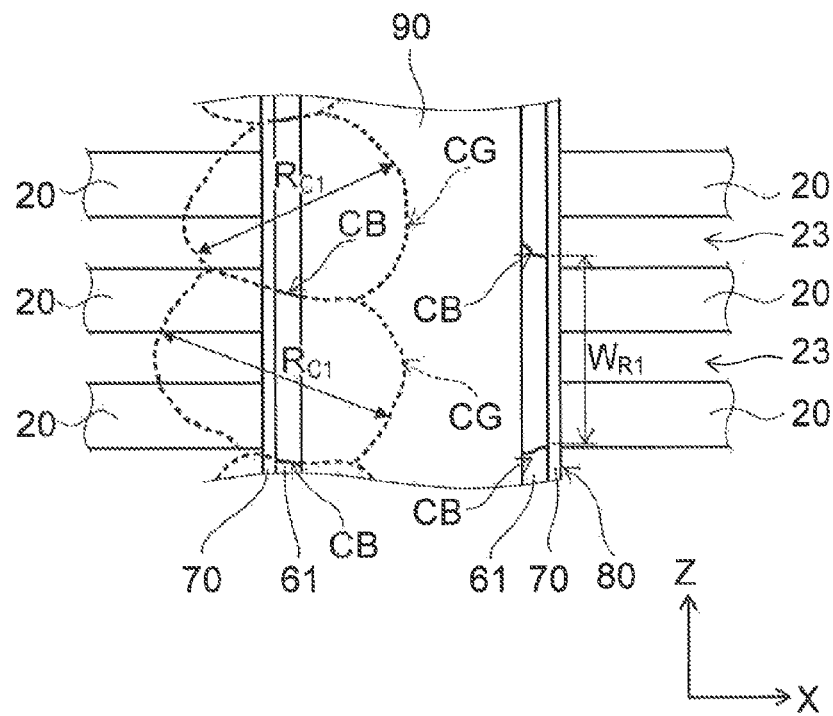

FIGS. 5A and 5B are schematic views showing the channel body 60, the memory film 70 and the core 90 which are embedded in the memory hole 80. FIGS. 5A and 5B also are schematic cross-sectional views of the memory hole 80 in parallel with the X-Z plane. FIG. 5A is the cross-sectional view of a portion of the memory hole 80 that includes the second portion 63 of the channel body 60. FIG. 5B is the cross-sectional view of a portion of the memory hole 80 that includes the first portion 61 of the channel body 60.

For example, the channel body 60 includes crystal grains CG as shown in FIGS. 5A and 5B. A dashed portion of each crystal grains CG, which is located outside the channel body 60, is a hypothetical portion illustrated for imaging a crystal grain, and thus, not actually exists. The boundaries between the crystal grains are shown in FIGS. 5A and 5B as the grain boundary CB.

For example, the thickness of the channel body 60 in a second direction (e.g., an X-direction) perpendicular to the Z-direction is about 20 nanometers (nm). In contrast, the crystal grain size RC1 of the first portion 61 is, for example, about 200 nm; and the crystal grain size RC2 of the second portion 63 is about 100 nm. Accordingly, the crystal grain boundaries CB of the channel body 60 are observed as discrete interfaces intersecting the Z-direction. Also, the average spacing WR1 in the Z-direction of the crystal grain boundaries of the first portion 61 is wider than the average spacing WR2 in the Z-direction of the crystal grain boundaries of the second portion 63.

As shown in FIG. 5A, the channel body 60 includes a PN junction 60j in a part of the second portion 63 that is adjacent to the select gate 30. The channel body 60 includes at least one crystal boundary CB in the vicinity of the PN junction 60J. The channel body 60 may include, for example, a PN junction 60j positioned at the boundary between the first portion 61 and the second portion 63. For example, the first portion 61 has a P-type conductivity; and the second portion 63 has an N-type conductivity. The PN junction 60J may be an interface between the crystal grains of the first portion 61 and the crystal grains of the second portion 63. Thus, the channel body 60 may include a crystal grain boundary positioned at the vicinity of the PN junction.

The memory cell array 1 includes multiple memory cells MC disposed in the Z-direction. The memory cells MC include portions of the memory film 70 and are provided between the channel body 60 and the word lines 20. The memory cells MC are arranged in the extension direction (the Z-direction) of the channel body 60. The number of memory cells provided in one memory hole 80 is equal to the number of stacks of word lines 20.

For example, the memory film 70 extends in the Z-direction. The memory film 70 has, for example, a structure in which a silicon oxide film, a silicon nitride film, and a silicon oxide film are stacked in order. In such a structure, the silicon nitride film acts as, for example, a charge storage layer.

The memory film 70 is not limited to the example recited above and may be, for example, a conductor provided between the channel body 60 and the word lines 20 and may have a structure including a charge storage layer made of a conductor disposed discretely in the Z-direction.

The memory cell array 1 includes a selection transistor ST1 and a selection transistor ST2. The selection transistor ST1 includes the selection gate 30, the channel body 60, and the memory film 70. The selection transistor ST2 includes the selection gate 40, the channel body 60, and the memory film 70. The selection gates 30 and 40 each act as a gate electrode. The channel body 60 acts as the channel of a transistor. The memory film 70 acts as the gate insulator film.

The memory cell array 1 includes an interconnect layer 110. The interconnect layer 110 is provided on the selection gate 30 with an inter-layer insulating film 25 interposed. The Interconnect layer 110 includes the bit line 50, a contact plug 53, and an insulating film 55. The bit line 50 and the contact plug 53 are provided inside the insulating film 55. The bit line 50 is electrically connected to the channel body 60 via the contact plug 53.

The memory cell array 1 includes a memory string in the memory hole 80. The memory string includes the multiple memory cells MC disposed between the two selection transistors ST1 and ST2. Also, one end of the memory string is electrically connected to the source layer 10; and the other end of the memory string is electrically connected to the bit line 50.

FIG. 2 is a block diagram showing the non-volatile memory device 100 according to the first embodiment. The non-volatile memory device 100 includes, for example, the memory cell array 1, a row decoder 101, a sense amplifier 103, a control circuit 105, and an interface 107. The control circuit 105 controls the row decoder 101 and the sense amplifier 103 based on instructions acquired from the outside via the interface 107. The control circuit 105 records information in the memory cells MC and reads the information from the memory cells MC via the row decoder 101 and the sense amplifier 103.

As shown in FIG. 2, the memory cell array 1 includes multiple stacked bodies 130. Each of the stacked bodies 130 includes the multiple word lines 20 and the selection gates 30 and 40. When viewed from the Z-direction, for example, the stacked bodies 130 are provided in rectangular configurations extending in the Y-direction. The stacked bodies 130 are disposed in the X-direction. Each of the stacked bodies 130 includes the multiple memory holes 80.

The row decoder 101 is connected to each of the multiple word lines 20, the selection gate 30, and the selection gate 40 and applies voltages to each. The sense amplifier 103 is connected to the multiple bit lines 50 and the source layer 10, applies voltages between the source layer 10 and the bit lines 50, and senses currents flowing between the source layer 10 and the bit lines 50. Thereby, the sense amplifier 103 reads the data from the memory cells. Also, the sense amplifier 103 discriminates the data read from the memory cells MC and can store the data temporarily therein.

For example, the bit line 50 extends in the X-direction and is electrically connected to the channel body 60 provided in one of the multiple memory holes 80 in each of the stacked bodies 130. Also, the control circuit 105 can access one memory cell MC by selecting one word line 20 via the row decoder 101 and by selecting one bit line 50 via the sense amplifier 103.

For example, when erasing the data stored in the memory cells MC, the control circuit 105 erases all of the data stored in a memory block unit including multiple memory strings.

For example, in the erasing operation of the data, Verase (e.g., 20 V) is applied to all of the bit lines 50 of the selected memory block; and the source layer 10 is set to be floating. Then, the potentials of the selection gates 30 and 40 are increased (e.g., Verase del=15 V). Thereby, a GIDL current (Gate Induced Drain Leak current) is generated at the gate end vicinity of the selection transistor ST1; and holes that are included in the GIDL current move into the first portion 61 of the channel body 60. Thereby, the potential of the first portion 61 becomes a value near Verase. Therefore, when the potentials of all of the word lines 20 inside the selected memory block are set to, for example, 0 V, the electrons are removed from the memory film 70 or the holes are injected inside the memory film 70, canceling charges that are stored in the memory cells MC inside the whole memory block. Thereby, the data of all of the memory cells in the memory block is erased.

In the operation recited above, it is desirable to reduce the time necessary for the data erasure by supplying the necessary amount of holes from the selection transistor ST1 to the channel body 60 in a short period of time. Also, in the case where the capacity of the memory cell array 1 is increased, for example, the number of stacks of word lines 20 is increased; and the number of memory cells MC included in the memory string is increased. In such a case, it is desirable to increase the supply of the holes to the channel body 60 to reliably erase the data of all of the memory cells MC.

In the embodiment, in the second portion 63 of the channel body 60, the density of the crystal grain boundaries is increased by reducing the crystal grain size of the second portion 63. Carrier traps (inter-band levels) are formed at the crystal grain boundaries. Accordingly, the carrier trap density of the second portion 63 may be increased. For example, the density of the carrier traps are also increased at the vicinity of the PN junction provided in the second portion 63. The generation of holes due to band-to-band tunneling via the carrier traps may be promoted when the PN junction is set to have a reverse bias. In other words, the supply of the holes to the first portion 61 can be increased by increasing the GIDL current of the selection transistor ST1. As a result, in the non-volatile memory device 100, the reduction of the data erase time and the reliable data erasure of the selected memory block are realized; and thus, it is possible to improve the data erasing characteristics.

Also, in the first portion 61 where the memory cells MC are provided, the amount of carrier traps is suppressed by increasing the crystal grain size. Thereby, the erasing characteristics can be improved without degrading the performance of the memory cells MC.

A method for manufacturing the non-volatile memory device 100 according to the first embodiment will now be described with reference to FIGS. 3A to 3L. FIGS. 3A to 3L are schematic cross-sectional views showing an example of the manufacturing processes of the memory cell array 1.

Figure 3A:
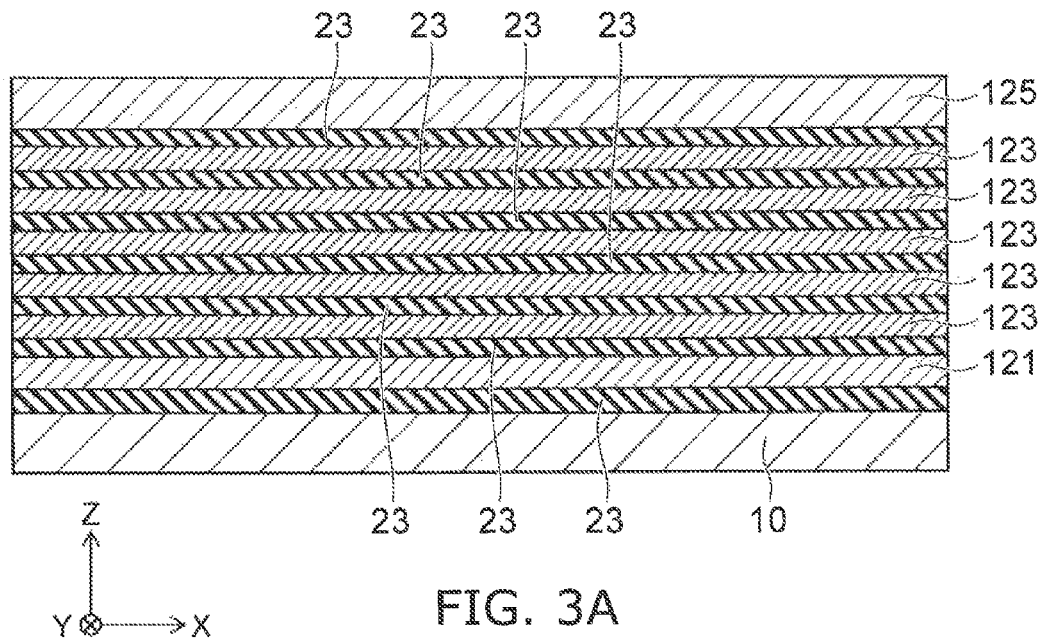

As shown in FIG. 3A, the insulating film 23 and a conductive layer 121 are formed in this order on the source layer 10. The insulating films 23 and conductive layers 123 are stacked alternately on the conductive layer 121. Each of the multiple conductive layers 123 is stacked in the Z-direction with the insulating film 23 interposed. The number of stacks of conductive layers 123 is equal to the number of memory cells MC disposed in the Z-direction. Further, a conductive layer 125 is formed on the insulating film 23 of the uppermost layer.

For example, the source layer 10 is formed on a substrate (not-shown). The substrate is, for example, a silicon substrate; and the source layer 10 is formed on the silicon substrate with an inter-layer insulating film interposed. The conductive layers 121, 123, and 125 are, for example, polycrystalline silicon (polysilicon) layers that have conductivity. The insulating films 23 are, for example, silicon oxide films. Also, the source layer 10 may be formed by diffusing an Impurity, etc., into a semiconductor substrate.

Figure 3B:
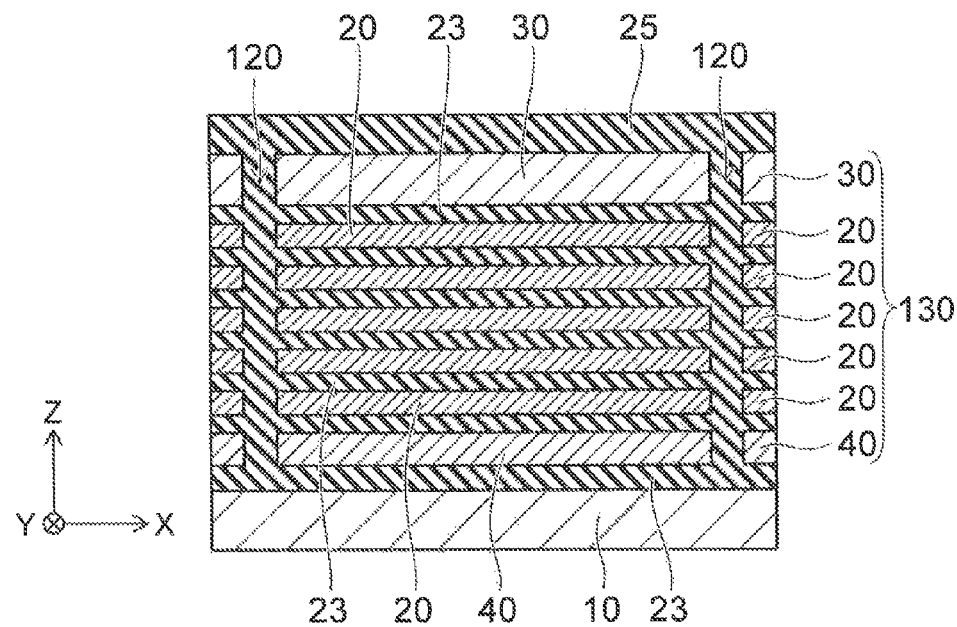

Then, the stacked bodies 130 that have stripe configurations are formed by dividing the conductive layers 121, 123, and 125 by a trench 120 extending in the Y-direction (referring to FIG. 2). As a result, the conductive layers 121, 123, and 125 are formed into the selection gate 40, the word lines 20, and the selection gate 30. Continuing as shown in FIG. 3B, the inter-layer insulating film 25 is formed to cover the stacked bodies 130. The inter-layer insulating film 25 covers the selection gate 40, the word lines 20, and the selection gate 30 and fills the trench 120. The inter-layer insulating film 25 is, for example, a silicon oxide film.

In the specification, "to cover" is not limited to the case where the "component that covers" directly contacts the "component that is covered" and includes the case where the "component that covers" covers the "component that is covered" with another component interposed.

The memory hole 80 is made as shown in FIG. 3C. For example, a through-hole is made from the upper surface of the inter-layer insulating film 25 to the source layer 10 using RIE (Reactive Ion Etching). For example, the memory hole 80 extends through the selection gate 40, the multiple word lines 20, and the selection gate 30 in the Z-direction.

As shown in FIG. 3D, the memory film 70 that covers the inner wall of the memory hole 80 is formed. The memory film 70 is, for example, a stacked film including a silicon oxide film and a silicon nitride film. For example, a silicon oxide film that covers the inner surface of the memory hole 80 and the upper surface of the inter-layer insulating film 25 is formed using CVD (Chemical Vapor Deposition). Then, a silicon nitride film is formed on the silicon oxide film; and another silicon oxide film is further formed on the silicon nitride film. The memory film 70 has, for example, a three-layer structure of the silicon oxide film/silicon nitride film/silicon oxide film. The memory film 70 is made conformally on the inner wall of the memory hole 80.

Figure 3E:
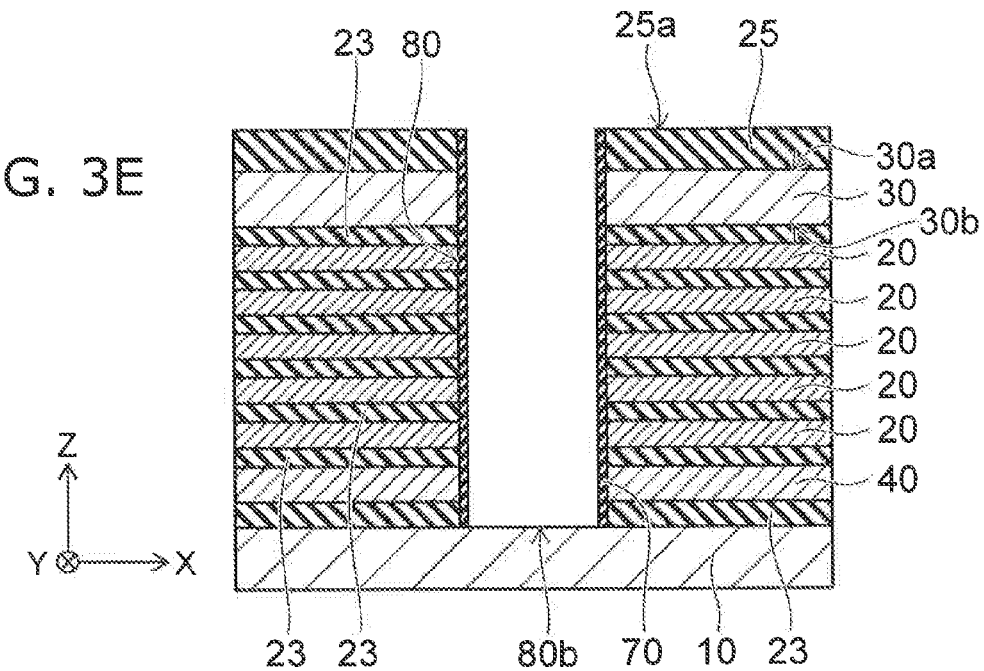

As shown in FIG. 3E, a memory film 70a that is formed on the inter-layer insulating film 25 and a memory film 70b that is formed on the bottom surface 80b of the memory hole 80 are selectively removed (referring to FIG. 3D). For example, the memory films 70a and 70b are selectively removed using anisotropic RIE; and the portion that is formed on the wall surface of the memory hole 80 remains. The source layer 10 is exposed at the bottom surface 80b of the memory hole 80.

Figure 3F:
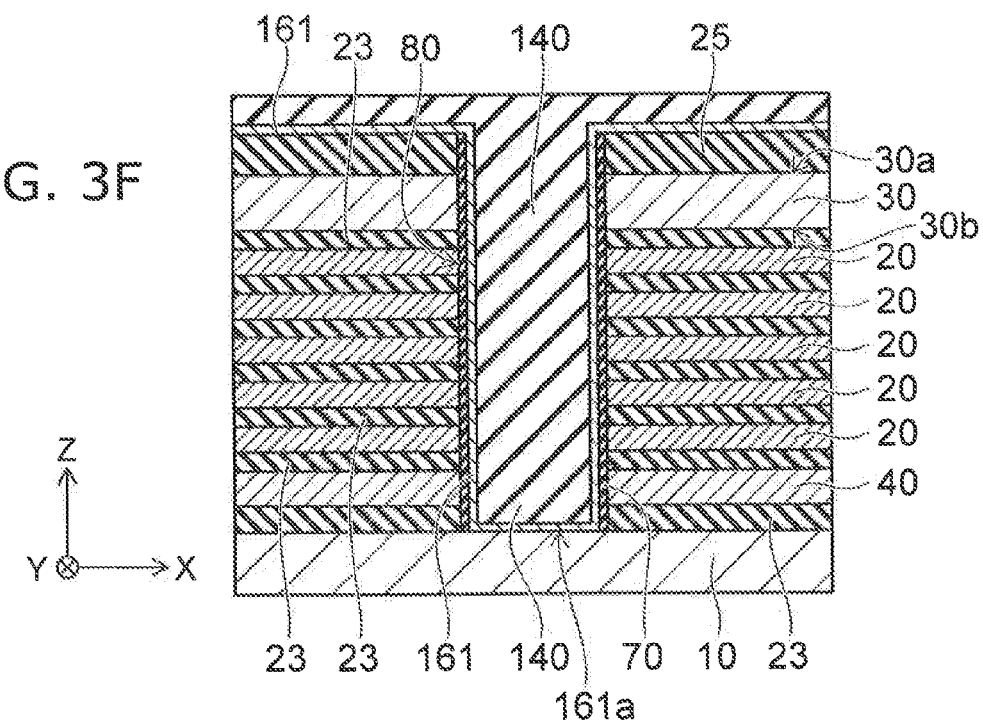

As shown in FIG. 3F, a semiconductor layer 161 that covers the inter-layer insulating film 25 and the inner surface of the memory hole 80 is formed. The semiconductor layer 161 is, for example, a polysilicon layer formed using CVD. The semiconductor layer 161 includes, for example, a P-type impurity. Also, the semiconductor layer 161 may be an undoped layer. The semiconductor layer 161 includes a portion 161a contacting the source layer 10 exposed at the bottom surface 80b of the memory hole 80. Thereby, the semiconductor layer 161 is electrically connected to the source layer 10.

Then, an insulating film 140 that fills the interior of the memory hole 80 is formed. The insulating film 140 is formed also on the inter-layer insulating film 25. The insulating film 140 is, for example, a silicon oxide film.

Figure 3G:
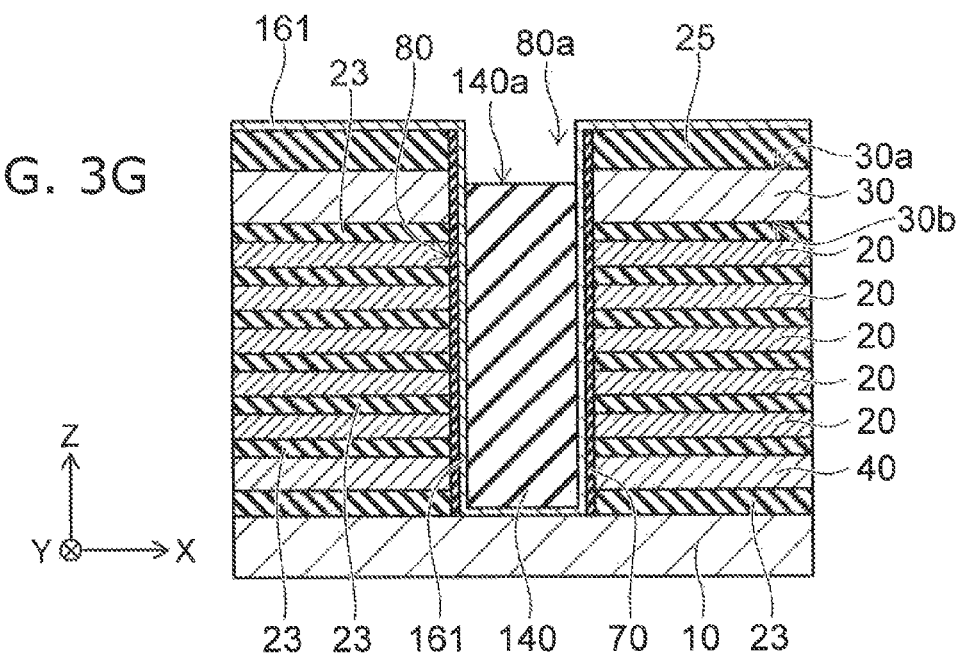

As shown in FIG. 3G, etch-back of the insulating film 140 is performed. For example, the portion that is formed on the Inter-layer insulating film 25 and in an upper portion 80a of the memory hole 80 is removed. Thereby, the semiconductor layer 161 that is formed on the inter-layer insulating film 25 and the semiconductor layer 161 that is formed in the upper portion 80a of the memory hole 80 are exposed. For example, an upper surface 140a of the insulating film 140 after the etchback is positioned at a level between an upper surface 30a and a lower surface 30b of the selection gate 30. Here, "level" is the position in the Z-direction and means, for example, the height from the upper surface of the source layer 10.

Figure 3H:
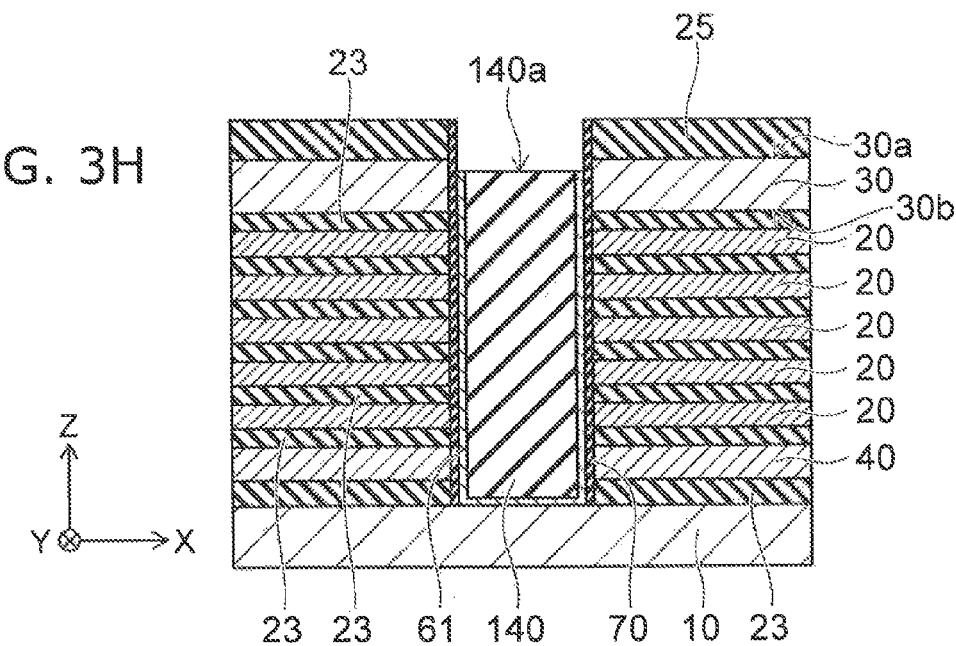

As shown in FIG. 3H, the semiconductor layer 161 that is exposed at the inter-layer insulating film 25 and the upper portion 80a of the memory hole 80 is removed by etching. Thereby, the first portion 61 of the channel body 60 is formed in the memory hole 80. The first portion 61 extends between the insulating film 140 and the memory film 70; and the upper end of the first portion 61 is positioned at a level between the upper surface 30a and the lower surface 30b of the selection gate 30.

As shown in FIG. 3I, a semiconductor layer 163 that covers the inter-layer insulating film 25 and the upper portion 80a of the memory hole 80 is formed. The semiconductor layer 163 is, for example, a polysilicon layer formed using CVD. The semiconductor layer 163 is formed so that the crystal grain size of the semiconductor layer 163 is smaller than the crystal grain size of the semiconductor layer 161. For example, carbon (C) or nitrogen (N) is doped when depositing the polysilicon. Thereby, the average crystal grain size of the semiconductor layer 163 is smaller than that of the case where carbon or nitrogen is not doped.

For example, an N-type impurity is doped into the semiconductor layer 163. For example, the N-type impurity may be doped when depositing the semiconductor layer 163. Also, ion implantation of the N-type impurity may be performed after depositing the semiconductor layer 163.

As shown in FIG. 3J, a portion 163a that is formed on the insulating film 140 of the semiconductor layer 163 and a portion 163b that is formed on the inter-layer insulating film 25 are selectively removed. For example, selective etching is performed using anisotropic RIE (Reactive Ion Etching). Thereby, the second portion 63 can be formed in the upper portion 80a of the memory hole 80.

The second portion 63 of the channel body 60 contacts the first portion 61 at the level of the upper surface 140a of the insulating film 140. In other words, the boundary between the first portion 61 and the second portion 63 is positioned at the level between the upper surface 30a and the lower surface 30b of the selection gate 30.

For example, a PN junction is formed at the boundary between the first portion 61 and the second portion 63. For example, the crystal grains of the first portion 61 contact the crystal grains of the second portion 63 at the boundary between the first portion 61 and the second portion 63. Accordingly, crystal grain boundaries exist at the boundary between the first portion 61 and the second portion 63. In other words, the channel body 60 includes crystal grain boundaries at the vicinity of the PN junction.

Figure 3K:
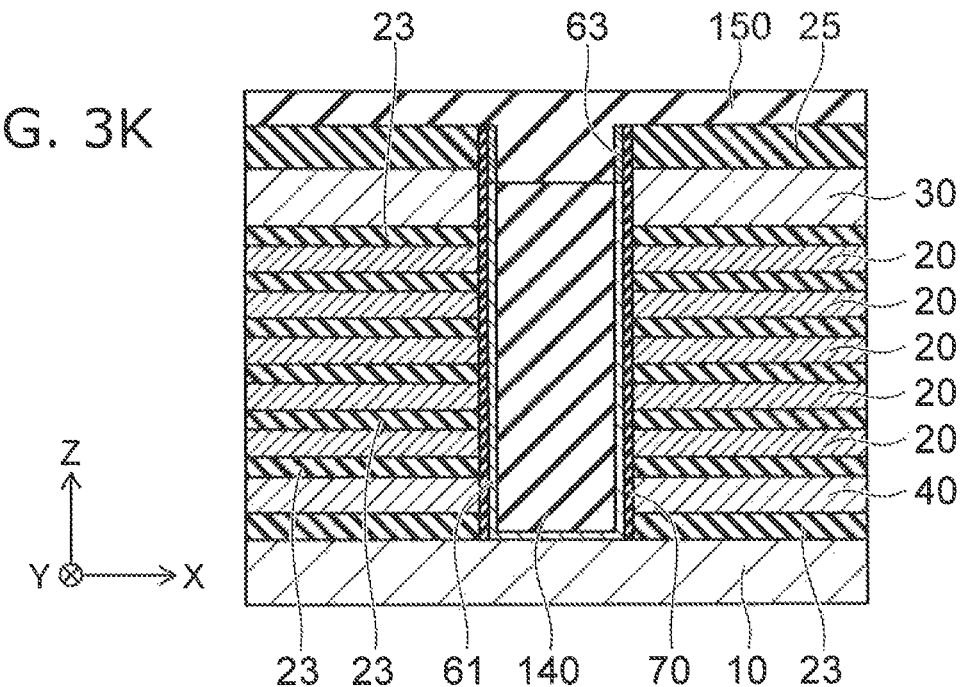

As shown in FIG. 3K, an insulating film 150 that fills the upper portion 80a of the memory hole 80 is formed. The insulating film 150 is formed also on the inter-layer insulating film 25. The insulating film 150 is, for example, a silicon oxide film. For example, the insulating film 150 becomes a single body with the insulating film 140 to form the core 90.

Figure 3L:
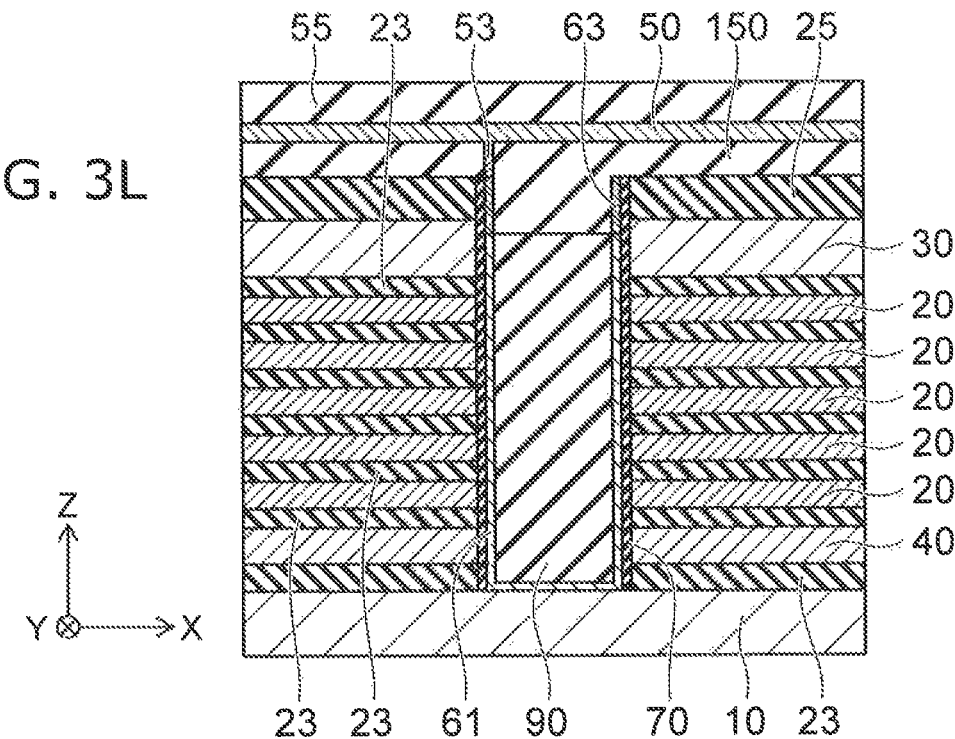

As shown in FIG. 3L, the bit line 50 is formed on the insulating film 150. For example, the bit line 50 is electrically connected to the channel body 60 via the contact plug 53 formed inside the insulating film 150. For example, the insulating film 55 is formed on the bit line 50. The insulating film 55 is an inter-layer insulating film covering the bit line 50. For example, the insulating film 55 becomes a single body with the insulating film 150 provided on the inter-layer insulating film 25. Thereby, the memory cell array 1 is completed.

As recited above, in the embodiment, the semiconductor layer 161 that includes a first crystal grain size and the semiconductor layer 163 that includes a second crystal grain size that is smaller than the first crystal grain size are formed in order. Thereby, the channel body 60 that includes the first portion 61 and the second portion 63 can be formed. The embodiment is not limited to the example recited above. Memory cell arrays 2 and 3 according to modifications of the embodiment will now be illustrated.

Figure 4A:
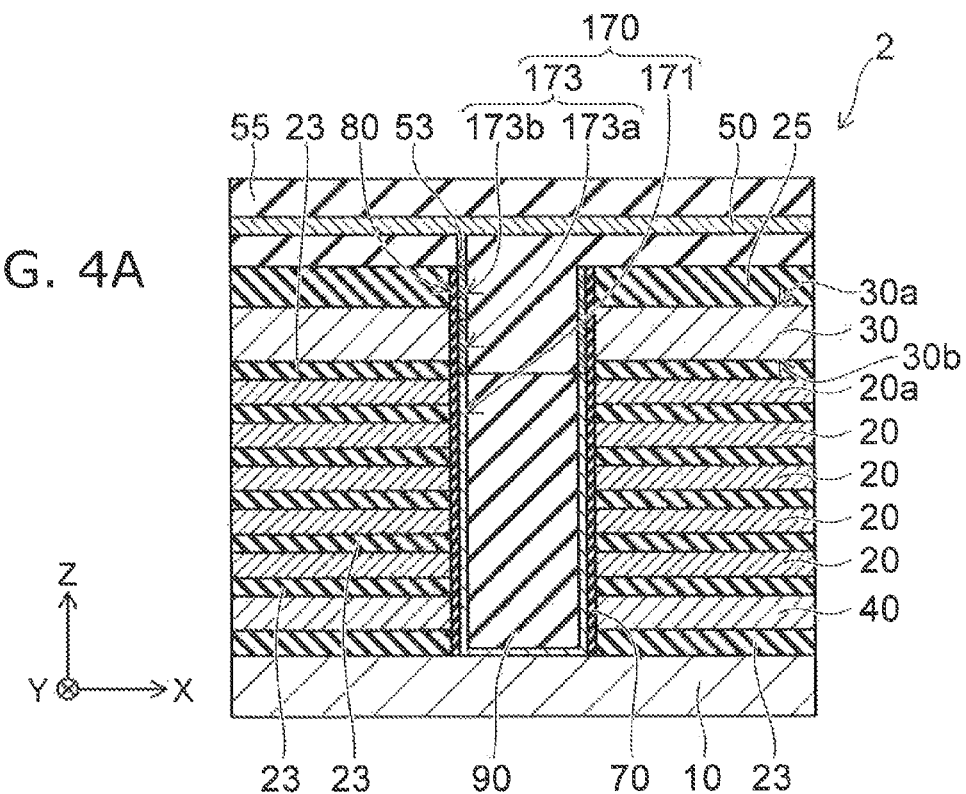
FIGS. 4A and 4B are cross-sectional views schematically showing memory cell arrays according to variations of the first embodiment.

FIG. 4A is a schematic cross-sectional view showing the memory cell array 2 according to a first modification of the first embodiment. The memory cell array 2 includes a channel body 170. The channel body 170 includes a first portion 171 and a second portion 173. Further, the second portion 173 includes a first conductivity-type unit 173a and a second conductivity-type unit 173b.

The second portion 173 is provided on the first portion 171 in the Z-direction. For example, the boundary between the first portion 171 and the second portion 173 is positioned at a level between the word line 20a and the selection gate 30. The word line 20a is positioned at the end of the multiple word lines on the selection gate 30 side.

The second conductivity-type unit 173b is provided on the first conductivity-type unit 173a. The boundary between the first conductivity-type unit 173a and the second conductivity-type unit 173b is positioned at a level between the upper surface 30a and the lower surface 30b of the selection gate 30. Here, the first conductivity type is the P-type; and the second conductivity type is the N-type.

In the example, the position of the boundary between the first portion 171 and the second portion 173 and the position of the PN junction are different. The PN junction is provided in the second portion 173 having the crystal grain size that is smaller than that of the first portion 171. Thereby, crystal grain boundaries are included at the vicinity of the PN junction; and the GIDL current can be increased in the erasing operation of the memory cell array 2.

For example, in the example shown in FIG. 1 as well, the boundary between the first portion 61 and the second portion 63 is formed to be different in the position from the PN junction. In such a case, the PN junction is formed to be positioned inside the second portion 63.

Figure 4B:
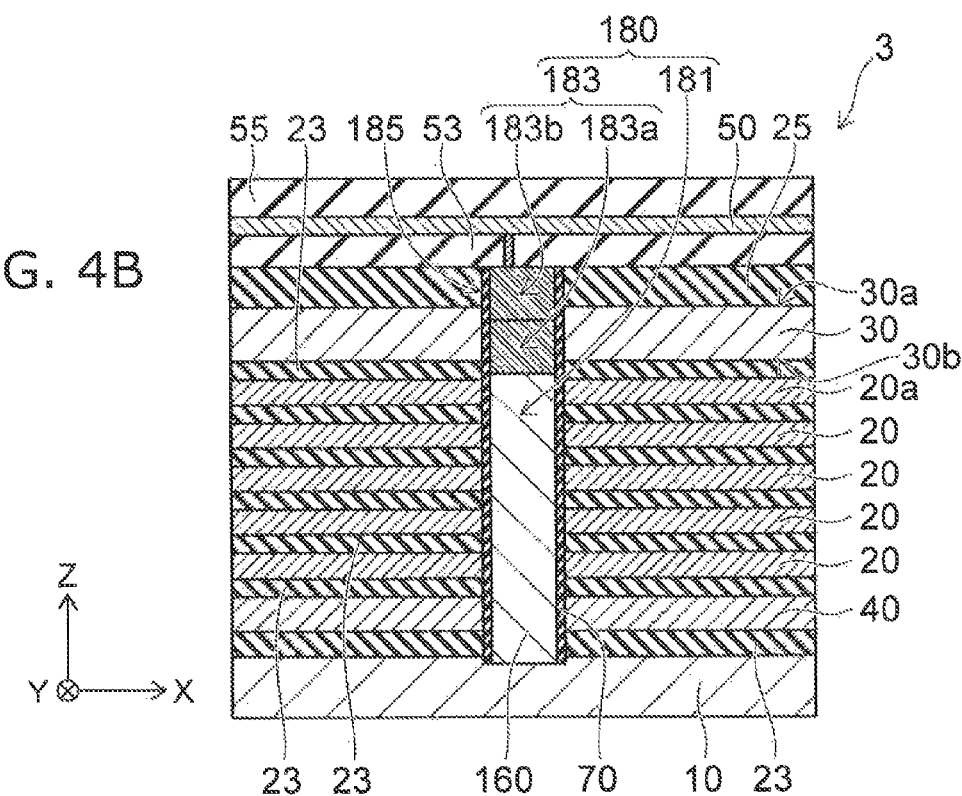

FIG. 4B is a schematic cross-sectional view showing the memory cell array 3 according to a second modification of the first embodiment. The memory cell array 3 includes a channel body 180. The channel body 180 includes a first portion 181 and a second portion 183. Further, the second portion 183 includes a first conductivity-type unit 183a and a second conductivity-type unit 183b. In the example, the core 90 is not provided.

The second portion 183 is provided on the first portion 181 in the Z-direction. For example, the boundary between the first portion 181 and the second portion 183 is positioned at a level between the word line 20a and the selection gate 30. The word line 20a is positioned at the end of the multiple word lines 20 on the selection gate 30 side.

The second conductivity-type unit 183b is provided on the first conductivity-type unit 183a. The boundary between the first conductivity-type unit 173a and the second conductivity-type unit 173b is positioned at a level between the upper surface 30a and the lower surface 30b of the selection gate 30. Here, the first conductivity type is the P-type; and the second conductivity type is the N-type.

In the manufacturing process of the memory cell array 3, each of the first portion 181 and the second portion 183 are formed to fill a memory hole 185. For example, the memory hole 185 is filled with a first semiconductor layer used to form the first portion 181. Then, etch-back of the first semiconductor layer is performed; and a space where the second portion 183 is formed is provided in the upper portion of the memory hole 185. Subsequently, the space of the upper portion of the memory hole 185 is filled by forming the second semiconductor layer that is used to form the second portion 183.

The second semiconductor layer is formed so that the crystal grain size of the second semiconductor layer is smaller than the crystal grain size of the first semiconductor layer. Also, the second semiconductor layer may be formed so that the crystal grain size of the second semiconductor layer gradually decreases in the stacking direction. For example, the amount of the carbon or nitrogen that is added is gradually increased when depositing the polysilicon.

Alternatively, the carbon or nitrogen may be added while forming a portion of the second semiconductor layer in the vicinity of the PN junction. Thus, the crystal grain size becomes smaller in the vicinity of the PN junction, and becomes larger as increasing a distance to the PN junction.

In the example as well, the position of the PN junction is different from the position of the boundary between the first portion 181 and the second portion 183. The PN junction is provided in the second portion 183 having the crystal grain size that is smaller than that of the first portion 181. Thereby, the crystal grain boundaries are included at the vicinity of the PN junction; and the GIDL current can be increased in the erasing operation of the memory cell array 2.

Second Embodiment

Figure 6:
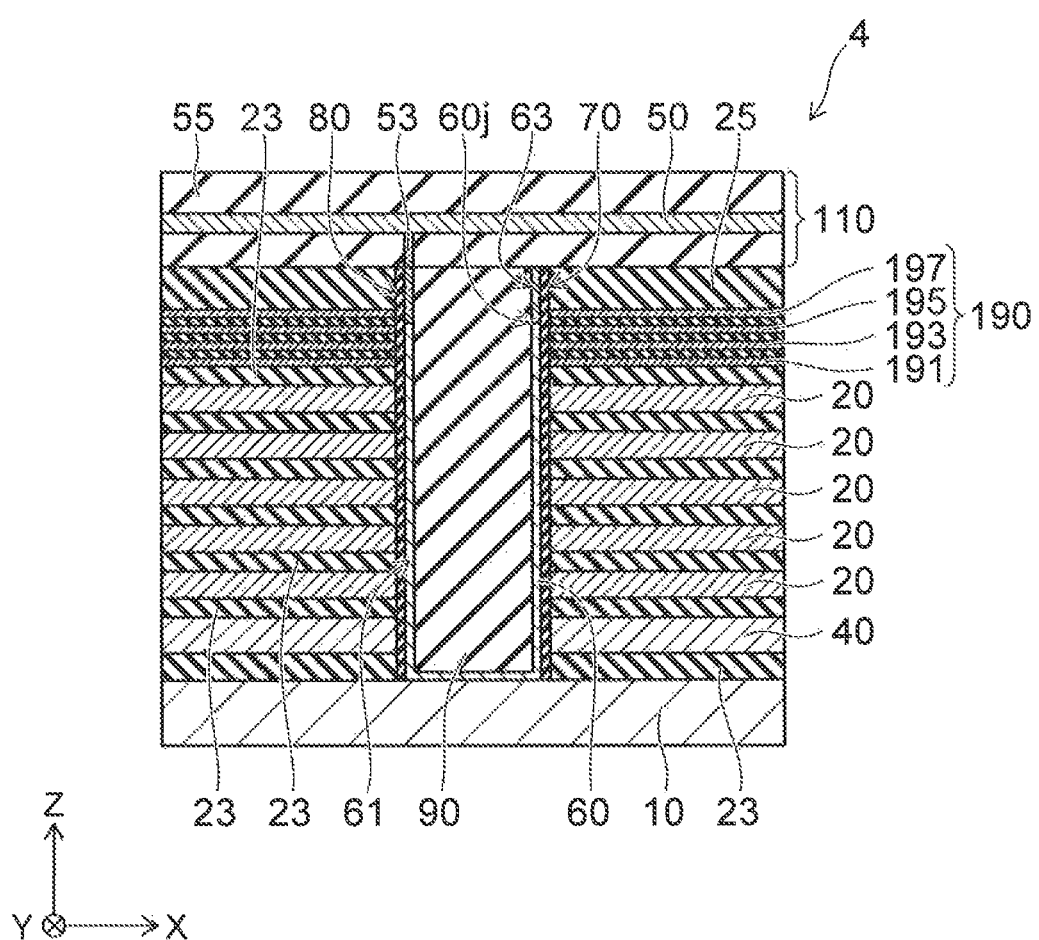
FIG. 6 is an exemplary cross-sectional view schematically showing a memory cell array according to a second embodiment.

FIG. 6 is a schematic cross-sectional view showing a memory cell array 4 according to a second embodiment. The memory cell array 4 includes a selection gate 190. The selection gate 190 includes multiple sub-layers 191, 193, 195, and 197 stacked in the Z-direction. The number of sub-layers included in the selection gate 190 is not limited to that of the example and may be, for example, two, three, five, or more.

An insulating film 27 is formed between each of the sub-layers. The insulating film 27 is, for example, a silicon oxide film. Also, for example, the sub-layers are electrically connected to each other at not-shown portions.

The channel body 60 includes the first portion 61 and the second portion 63. The crystal grain size of the second portion 63 is smaller than the crystal grain size of the first portion 61. The second portion 63 is adjacent to at least one of the multiple sub-layers. For example, the boundary 60j between the first portion 61 and the second portion 63 is positioned at a level between the sublayer 195 and the sublayer 197 in the Z-direction.

The first portion 61 has the N-type conductivity; and the second portion 63 has the P-type conductivity. In other words, the channel body 60 includes a PN junction; and the position of the PN junction matches the boundary 60j between the first portion 61 and the second portion 63.

Also, the PN junction of the channel body 60 may not match the boundary 60j. For example, the boundary 60j may be positioned between the sub-layer 193 and the sub-layer 195; and the PN junction may be positioned inside the portion adjacent to the sub-layer 197 of the second portion 63.

The PN junction is provided in the second portion 63 having the crystal grain size that is smaller than that of the first portion 61. Thereby, crystal grain boundaries are included at the vicinity of the PN junction; and the GIDL current can be increased in the erasing operation of the memory cell array 4.

Third Embodiment

Figure 7:
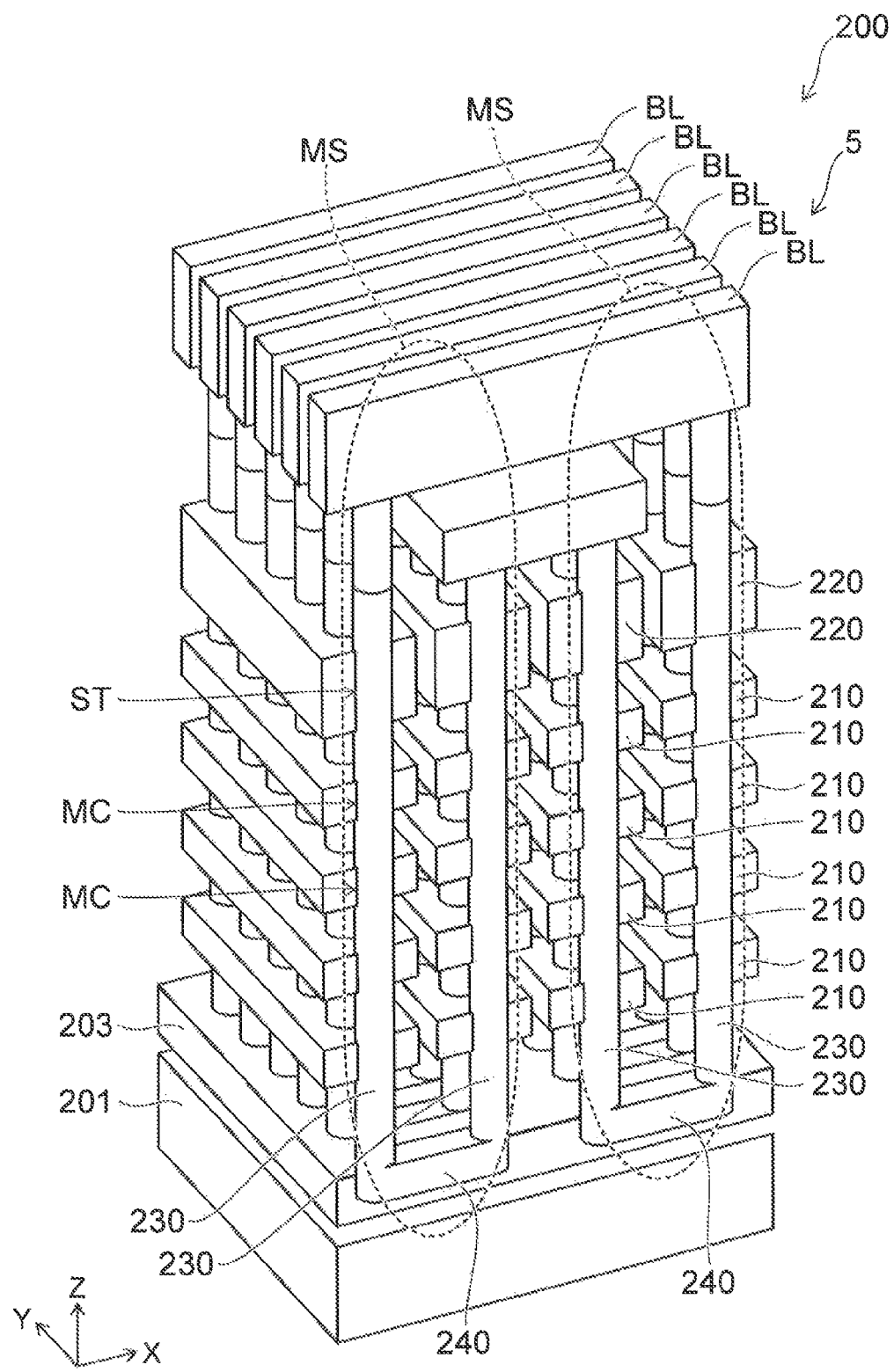
FIG. 7 is a schematic perspective view showing a memory cell array according to the third embodiment.

FIG. 7 is a perspective view schematically showing a nonvolatile memory device 200 according to a third embodiment. The nonvolatile memory device 200 includes a memory cell array 5 having a three-dimensional structure.

As shown in FIG. 7, the nonvolatile memory device 200 includes, for example, a memory cell array 5 provided on a silicon substrate 201 with a back gate layer 203 interposed therebetween. The memory cell array 5 includes multiple word lines 210 and selection gates 220 stacked in the Z-direction. Also, the word lines 210 and the selection gates 220 are arranged in the X-direction. Further, the memory cell array 5 includes semiconductor pillars 230 extending through the word lines 210 and the selection gates 220 stacked in the Z-direction.

For example, two semiconductor pillars 230 that are adjacent to each other in the X-direction are connected by a pipe connection (PC) 240 in the back gate layer 203. Then, one end of the semiconductor pillars 230 connected via the PC 240 is electrically connected to a bit line BL. Also, the other end of the semiconductor pillars 230 is electrically connected to a source line SL.

Memory cells MC are formed at the portions where the semiconductor pillars 230 extend through each of the word lines 210. Also, selection transistors are formed between the selection gates 220 and the semiconductor pillars 230. Thereby, a memory string MS is provided along the two mutually-adjacent semiconductor pillars 230.

Each semiconductor pillar 230 includes, for example, a channel body 60, a memory film 70 and core 90 (see FIGS.

5A and 5B). The channel body 60 includes a plurality of crystal grains, wherein a crystal grain size in the first portion 61 is larger than a crystal grain size in the second portion 63. In this example, the first portion 61 is adjacent to the word lines 210, and the second portion 63 is adjacent to at least a part of the selection gate 220, thereby increasing the GIDL current when erasing data in the memory cell array 5.

Figure 8A:
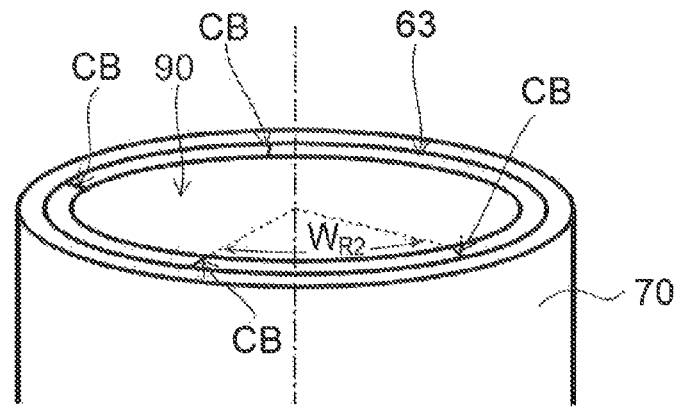
FIGS. 8A and 8B are schematic cross-sectional views showing a channel body of the memory cell array according to the third embodiment.
Figure 8B:
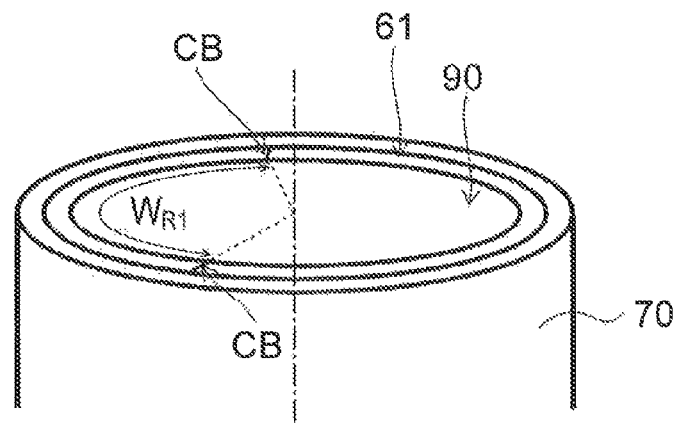

FIGS. 8A and 8B are schematic perspective views showing the channel body 60, the memory film 70 and the core 90 which are embedded in the memory hole. FIGS. 8A and 8B also are schematic cross-sectional views of the memory hole in parallel with the X-Y plane. FIG. 8A is the cross-sectional view of a portion of the memory hole that includes the first portion 61 of the channel body 60. FIG. 8B is the cross-sectional view of a portion of the memory hole that includes the second portion 63 of the channel body 60.

The cross sections of the channel body 60 in FIGS. 8A and 8B include the crystal grain boundaries CB. The crystal grain boundaries CB have distance $W_{R1}$ or $W_{R2}$ therebetween in FIGS. 8A and 8B respectively, which is defined as a distance along the periphery of the channel body 60. As described above, the crystal grain size in the first portion 61 is larger than the crystal grain size in the second portion 63, and thus, the average of the distance $W_{R1}$ in the first portion 61 in FIG. 8B is wider than the average of the distance $W_{R2}$ in the second portion 63 in FIG. 8A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
   word lines arranged in a first direction;
   a selection gate arranged in the first direction with the word lines;
   a semiconductor layer extending in the first direction through the word lines and the selection gate and having a first portion and a second portion, the first portion being adjacent to the word lines, the second portion being adjacent to at least a part of the selection gate, and the semiconductor layer including a PN junction in the second portion;
   a memory film between each of the word lines and the semiconductor layer; and
   a bit line electrically connected to the semiconductor layer, the second portion being positioned between the first portion and the bit line,
   wherein the semiconductor layer includes first crystal grains in the first portion and second crystal grains in the second portion, the second crystal grains being made of the same material as the first crystal grains;
   an average size of the first crystal grains is larger than an average size of the second crystal grains; and
   a grain boundary between two adjacent crystal grains among the first crystal grains and the second crystal grains locates at a position adjacent to the PN junction.

* * * * *